United States Patent [19]
Bawolek et al.

[11] Patent Number: 5,914,749
[45] Date of Patent: Jun. 22, 1999

[54] MAGENTA-WHITE-YELLOW (MWY) COLOR SYSTEM FOR DIGITAL IMAGE SENSOR APPLICATIONS

[75] Inventors: Edward J. Bawolek, Chandler; Zong-Fu Li, Gilbert; Ronald Dean Smith, Phoenix, all of Ariz.

[73] Assignee: Intel Corporation, Santa Clara, Calif.

[21] Appl. No.: 09/052,370

[22] Filed: Mar. 31, 1998

[51] Int. Cl.[6] .................................................. H04N 5/335
[52] U.S. Cl. ........................................ 348/273; 348/280
[58] Field of Search .................................. 348/290, 332, 348/266, 272, 273, 276, 277, 280, 274, 224, 275, 237; 257/440; H04N 9/07, 9/84, 9/64

[56] References Cited

U.S. PATENT DOCUMENTS

| | | |
|---|---|---|
| 3,971,065 | 7/1976 | Bayer . |
| 4,876,167 | 10/1989 | Snow .............................................. 430/7 |
| 5,018,006 | 5/1991 | Hashimoto ................................... 358/44 |

FOREIGN PATENT DOCUMENTS 61-167296  7/1986  Japan .

*Primary Examiner*—Wendy Garber
*Assistant Examiner*—Andrew D. Martin
*Attorney, Agent, or Firm*—Blakely, Sokoloff, Taylor & Zafman

[57] ABSTRACT

A color imaging device of a plurality of light selective elements. The light selective elements include a first light selective element selective to light having a wavelength corresponding to the Magenta region of the spectrum, a second light selective element selective to light having a wavelength corresponding to the White region of the spectrum, and a third light selective element selective to light having a wavelength corresponding to the Yellow region of the spectrum.

13 Claims, 10 Drawing Sheets

| M | W | M | W | M | W | M | W | M | W |
|---|---|---|---|---|---|---|---|---|---|
| W | Y | W | Y | W | Y | W | Y | W | Y |
| M | W | M | W | M | W | M | W | M | W |
| W | Y | W | Y | W | Y | W | Y | W | Y |
| M | W | M | W | M | W | M | W | M | W |
| W | Y | W | Y | W | Y | W | Y | W | Y |
| M | W | M | W | M | W | M | W | M | W |
| W | Y | W | Y | W | Y | W | Y | W | Y |

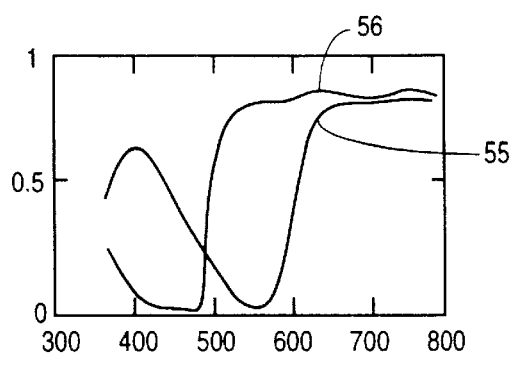 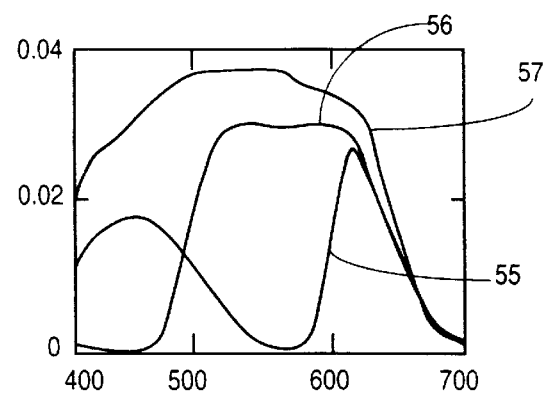
Fig. 2a  Fig. 2b
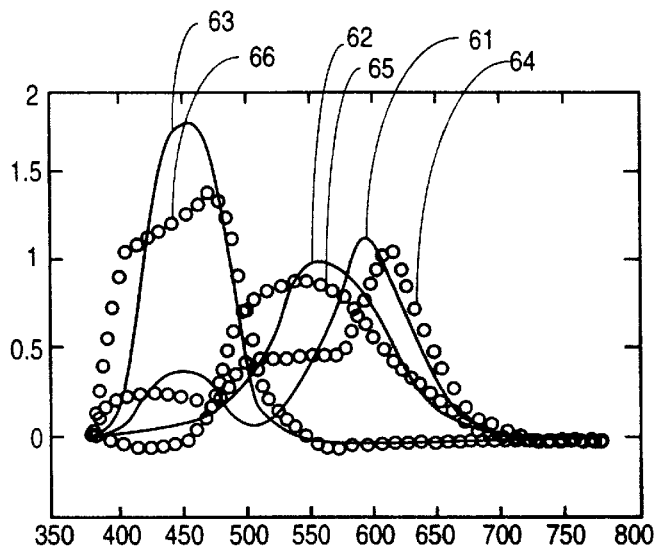
Fig. 2c

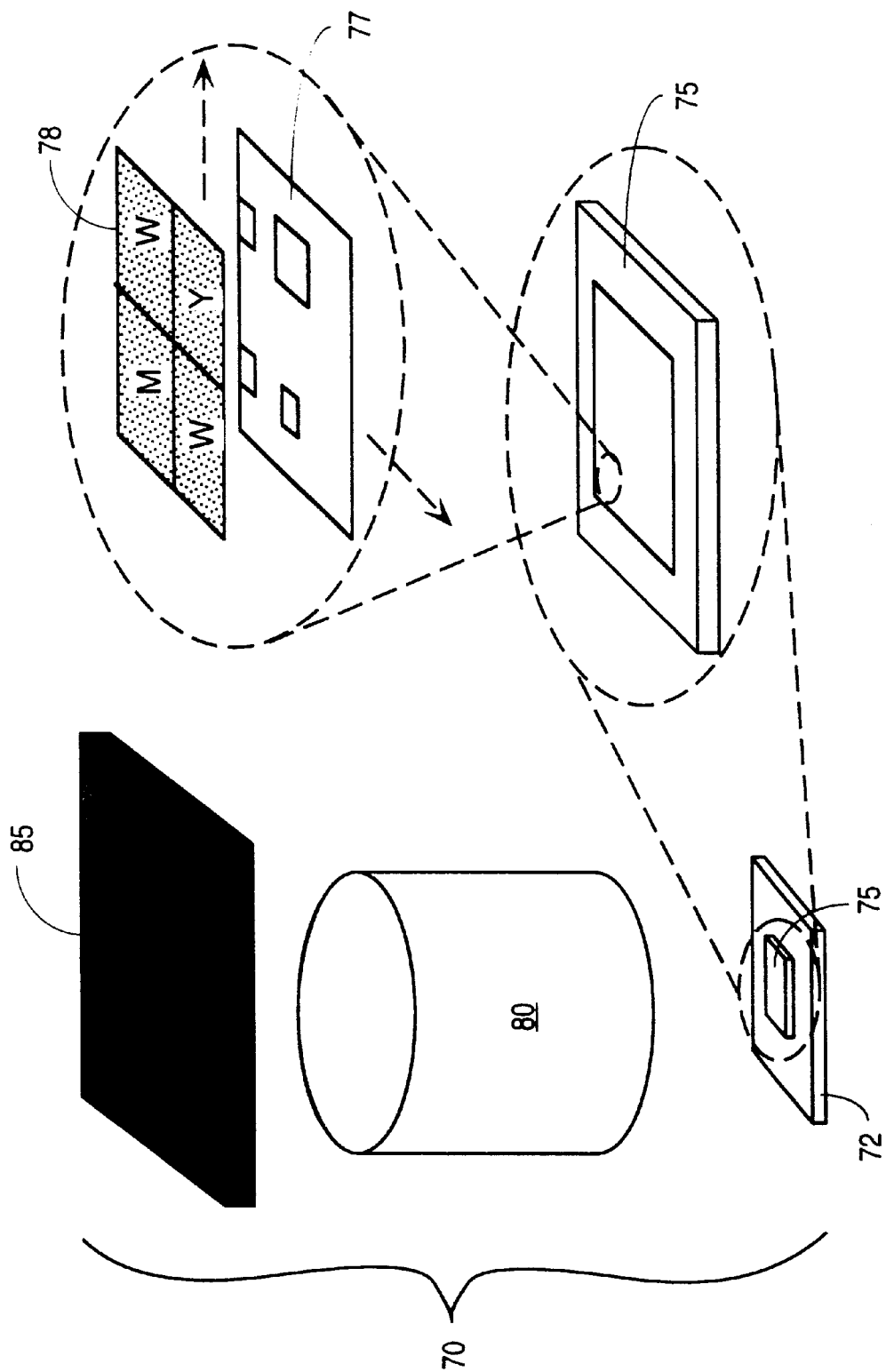

| M | W | M | W | M | W | M | W | M | W |
|---|---|---|---|---|---|---|---|---|---|
| W | Y | W | Y | W | Y | W | Y | W | Y |
| M | W | M | W | M | W | M | W | M | W |
| W | Y | W | Y | W | Y | W | Y | W | Y |
| M | W | M | W | M | W | M | W | M | W |
| W | Y | W | Y | W | Y | W | Y | W | Y |
| M | W | M | W | M | W | M | W | M | W |
| W | Y | W | Y | W | Y | W | Y | W | Y |

Fig. 3b

MAGENTA-WHITE-YELLOW (MWY) COLOR SYSTEM FOR DIGITAL IMAGE SENSOR APPLICATIONS

BACKGROUND OF THE INVENTION

1. Field of the Invention

The invention relates to imaging sensors and more particularly to a color system for imaging sensors.

2. Description of Related Art

Digital color imaging devices are routinely built by overlaying color filter arrays (CFA) on a charge coupled device (CCD) or complimentary metal oxide semiconductor (CMOS) imagers. In general, a CFA is made of three or more color channels that are each selective to visible light and therefore limit the light that is incident on an imaging sensor. The color filter channels selectively allow light corresponding to a predetermined range of the visible spectrum to pass through a channel to the imaging sensor. Thus, a CFA allows light having the color content of the imaged scene to be estimated by appropriate operation of the device on the responses of the camera colored channels. Commonly used color schemes include red-green-blue (RGB), cyan-magenta-yellow (CMY), and cyan-magenta-yellow-green (CMYG). Color schemes employing a "white" or uncolored pixel, have also been reported. These include a cyan-white-yellow-green (CWYG) color system reported by Hitachi Ltd., Mobara Works of Mobara, Japan and a cyan-white-green (CWG) system reported by RCA Laboratories of Zurich, Switzerland.

The considerations for any color system generally include the color fidelity, the signal-to-noise ratio of the imaging system, and the manufacturability of the sensor. Color fidelity deals with the capability of the color system to accurately measure or reproduce the color of the imaged scene, i.e. the ability to render a colorimetrically accurate image. The signal-to-noise ratio of the imaging system, e.g., camera system deals with the number of signals delivered by the sensor to the system that are attributable to photons and thus the imaged scene. Finally, the manufacturability of the sensor is concerned with the various processing steps, costs, and yield in the manufacturing of a particular sensor for an imaging system.

Color fidelity is a consequence of the CFA characteristics. The goal of any color system is to match or predict the human eye response. A color system is successful if it can match the color sensors of the eye or if the system is made up of colors that have enough difference between them over the visible spectrum that, through a mathematical manipulation, the system can effectively predict the human eye response. It is to be appreciated that sophisticated mathematics can be used to adapt any color combination to the human eye response. However, sophisticated mathematics are not ordinarily used because of the degree of mathematics required at each of the thousands of pixels of a given image, i.e., the time factor, and the concern of increasing or multiplying the amount of noise present in any sensor. Thus, for simplicity and practicality, color systems selected based on their ability to match the human eye response through a mathematical manipulation are generally limited to such color systems that allow such manipulation to occur via a 3×3 matrix transformation of the numerical data as opposed to larger matrix transformations.

As mentioned above, no image is free of noise. In a digital sensor, photons strike the sensor and the sensor converts the photons, generally through the use of a photodiode or similar device, to electrons. However, as yet, electrical sensors are not perfect and some electrons pass through the diodes as leakage or dark current that are not representative of the photons of the imaged scene. Thus, when the final signal of the imaged scene is collected, a leakage or dark current is present and it is difficult to distinguish an electron originating from a photon from an electron that is attributable to leakage or dark current. The leakage or dark current is characterized as a source of noise. There are other sources of noise, including a source of noise resulting from a quantization error of reducing the information content of a signal to its digital value.

The above sources of noise allow an evaluation of the signal-to-noise ratio of a color system. An RGB system, for example, divides the range of the visible spectrum that a human eye can see (approximately 400–700 nanometers) into three colors based on their frequency and wave lengths, RGB. Each Red, Green, or Blue filter passes about one-third of the available light through its color channel. Therefore, each color channel ignores two-thirds of the available photons for an imaged scene. Thus, two-thirds of the light that is incident on the filter goes to waste and is never used to create a signal in the camera. The amount of noise attributable to the sensor can be reduced if each color channel is exposed to more of the available photons.

A CMY color scheme or color system is known as a complimentary set of colors. By complimentary, the individual colors Cyan, Magenta and Yellow, provide a broader spectrum than either Red, Green, or Blue. Cyan is a combination of blue and green. Magenta is a combination of blue and red. Yellow is a combination of green and red. In effect, each Cyan, Magenta, or Yellow passes two-thirds of the available light of an imaged scene. Only one-third of the photons are ignored on a given color channel. This would appear to decrease the noise by a factor of two over the RGB system, since twice as much light is seen by the sensors as an RGB system. However, the reduction in noise benefit must be reduced somewhat by the mathematical manipulation of the color channels to predict the human eye response. In other words, the complimentary scheme CMY requires more mathematical manipulation than the non-complimentary RGB color scheme and, because there is still some noise present in the captured image, that noise is increased through the mathematical manipulation.

An RGB color scheme is often selected for ease of signal processing and generally good color fidelity. CMY and CMYG systems are often employed where it is desirable to improve the light sensitivity of the camera system by maximizing the integrated transmittance of the color filters over the visible spectrum. Because additional signal processing is necessary to recover an RGB color signal suitable, for example, to display on a computer monitor, from CMY or CMYG systems, the color fidelity is sometimes compromised in favor of an improved signal-to-noise ratio.

BRIEF SUMMARY OF THE INVENTION

The invention relates to a color imaging device. The color imaging device is comprised of a plurality of light selective elements. The light selective elements include a first light selective element selective to light having a wavelength corresponding to the Magenta region of the spectrum, a second light selective element selective to light having a wavelength corresponding to the White region of the spectrum, and a third light selective element sensitive to light having a wavelength corresponding to the Yellow region of the spectrum.

BRIEF DESCRIPTION OF THE DRAWINGS

FIG. 2a shows the transmittance characteristics of a MWY CFA material system in accordance with an embodiment of the invention.

FIG. 2b shows the response characteristics of a camera system based on a MWY CFA material system in accordance with an embodiment of the invention.

FIG. 2c shows the response characteristics of a camera system based on an MWY CFA materials after conversion into a target color space by means of a 3×3 matrix transformation.

FIG. 3a shows a diagrammatic view of a portion of an imaging system in accordance with one embodiment of the invention.

FIG. 3b shows one embodiment of a tiling pattern for MWY CFA material in accordance with the invention.

DETAILED DESCRIPTION OF THE INVENTION

The invention relates to a color imaging device comprised of an array of light selective elements. The light selective elements include a first light selective element selective to light having a wavelength corresponding to the Magenta region of the spectrum. The second light selective element is selective to light having a wavelength corresponding to the White region of the spectrum. A third light selective element is selective to light having a wavelength corresponding to the Yellow region of the spectrum. The invention also relates to a color-imaging sensor having an array of Magenta-White-Yellow (MWY) light selective elements such as described. Still further, the invention relates to an imaging sensor and an imaging system each utilizing a MWY color system.

The MWY system disclosed in the invention provides excellent color fidelity. The use of a White pixel means that no visible light incident on the White pixel is ignored by the sensor. The Magenta and Yellow color channels are complimentary and therefore pass at least two-thirds of the available light when compared to non-complimentary systems like RGB. Compared to an RGB color system, the MWY system therefore provides an improved signal-to-noise ratio, reflected in a more accurate prediction of the human eye color response.

The manufacturability of the imaging device is also maximized since the White CFA material need not be a conventional filter material (e.g., acrylate, polyimide, etc.). This potentially reduces the CFA materials needed for a color system to two for a three color system. This provides a lower fabrication cost, better equipment utilization, and improved yield.

Figure 1A:
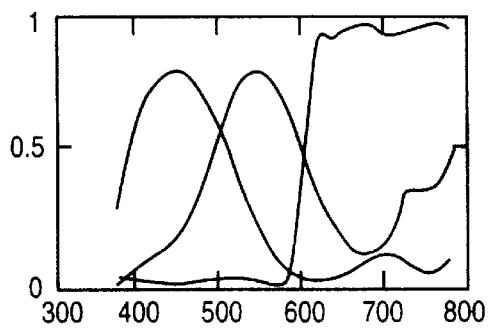
FIG. 1*a* shows the transmittance characteristics of a conventional RGB CFA material.

FIG. 1a presents the transmittance characteristics of a conventional RGB CFA material. As noted above, the Red, Green, and Blue filter materials have different transmittance characteristics between them that span the visible spectrum, i.e., approximately 400–700 nanometers. The graph shows a Red CFA material having a peak transmissivity at about 600 nanometers, a Green CFA material having a peak transmissivity at about 550 nanometers, and a Blue CFA material having a peak transmissivity at about 450 nanometers.

Figure 1B:
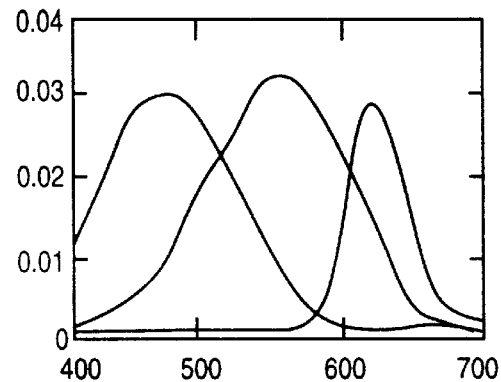
FIG. 1b shows the relative response characteristics of a camera system based on a conventional RGB CFA.

FIG. 1b presents the response characteristics of a camera system based on a conventional RGB CFA material. While FIG. 1a considered the color channel based on the filter material in isolation, FIG. 1b looks at the color channel in terms of the camera system as a whole. FIG. 1b shows the relative response characteristics of the three camera color channels after combining the characteristics of the CFA material with the sensor responsivity and the characteristics of an infrared blocking filter designed to cut-off wavelengths longer than approximately 700 nanometers. The values shown are arbitrary units.

Figure 1C:
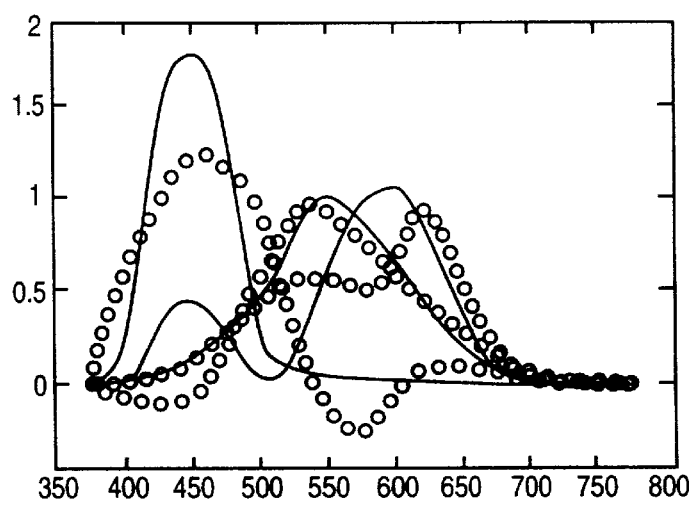
FIG. 1c shows the response characteristics of a camera system after conversion into a target color space by means of a 3×3 matrix transformation.

FIG. 1c shows the same camera system based on RGB CFA material after the system is converted into CIE XYZ target color space by means of a 3×3 matrix transformation. "CIE" stands for the Commission Internationale de l-Éclirage (International Commission on Illumination). CIE XYZ represents a standard method of defining a color space numerically.

FIG. 1c shows the ideal behavior of a camera system in solid lines. FIG. 1c shows the camera response of the RGB color system after conversion into CIE XYZ color space in dotted lines. It is to be noted that the Green CFA material matches closest to the ideal behavior (i.e., closest to the Y color channel), while the Blue and Red are skewed from the X and Z channels, respectively. Ideally, the system response after 3×3 matrix transformation would exactly match the ideal characteristics shown. If this match were achieved, the camera system would have the same color discrimination capability as a human being. In other words, the camera system would be able to recognize any visible color without error. Because the actual match between the system response and the ideal curves is not exact, the camera system will have some potential errors in color recognition. However, most colors in the natural world are broadly distributed over the visible spectrum. Therefore, regions where the camera system under-responds to a given color tend to be compensated for by regions of over-response. Errors tend to be "averaged out." The result is that a camera system having, for example, an RGB color system, can still produce satisfactory representations of most colors giving a satisfactory "user experience."

FIG. 2a shows the transmittance characteristics of a MWY color system in accordance with an embodiment of the invention. The White CFA material is perfectly transmissive over the entire spectrum range and therefore does not appear in FIG. 2a. The Magenta and Yellow CFA material are complimentary, with Magenta 55 having transmissivity peaks at approximately 425 nanometers and again at 625 nanometers. Yellow CFA material 55 has a single peak starting at approximately 500 nanometers and extending over the remainder of the visible spectrum. FIG. 2a shows that the MWY color system has enough difference between the individual colors Magenta 55, Yellow 56, and White to allow a mathematical manipulation to effectively predict the human eye response. The MWY color system may be converted to the RGB color system through the following mathematical manipulation:

$$Y + M - W = (R + G) + (B + R) - (R + G + B)$$
$$= R$$
$$W - M = (R + G + B) - (B + R)$$
$$= G$$
$$W - Y = (R + G + B) - (R + G)$$
$$= B.$$

FIG. 2b shows the response characteristics of a camera system based on a MWY CFA material. In this case, although White is completely transmissive over the entire spectrum, when the sensor response and IR blocking filter characteristics of the system are considered, the response characteristic of White yields a slope, as illustrated by line 57, in both the Red and Blue ends of the visible spectrum.

FIG. 2c represents a camera response of a camera system based on MWY CFA material after conversion of the signal into CIE XYZ color space by means of a 3×3 matrix transformation. The solid lines in FIG. 2c represent the ideal behavior. X is represented by line 61, Y by line 62, and Z by line 63. The dotted lines represent the response of the camera system based on MWY CFA material, X is represented by line 64, Y by line 65, and Z by line 66. When comparing FIG. 2c to FIG. 1c, it is clear that the MWY CFA material also deviates from the ideal response. However, analysis of the system color response indicates that excellent color fidelity is possible with these characteristics.

The following calculation method was used to convert the response characteristics shown in FIG. 2b into the CIE XYZ color space response shown in FIG. 2c:

$$\begin{bmatrix} X \\ Y \\ Z \end{bmatrix} = [\text{Mat } 3 \times 3] \begin{bmatrix} M \\ W \\ Y \end{bmatrix}$$

The 3×3 matrix values calculated are as follows:

$$[\text{Mat } 3 \times 3] = \begin{pmatrix} 1.893 & -0.734 & 1.755 \\ -1.136 & 0.481 & 1.655 \\ 0.193 & 2.997 & -3.579 \end{pmatrix}$$

The following table represents the numerical estimate of the color reproduction errors for an MWY camera system in accordance with an embodiment of the invention. The numbers presented are in CIE Lab units. CIE Lab represents a second standard color space. The values in the matrix represent the error of the predicted color from the MWY system relative to a Macbeth Colorchecker® produced by Gretag Macbeth Corporation of New Windsor, N.Y. The Lab values are in one-to-one correspondence to the positions of colors on a Macbeth Colorchecker®. The upper left corner corresponds to the Macbeth color labeled "Dark Skin"; the lower right corner corresponds to the Macbeth color labeled "Black."

$$\Delta E_{Lab} = \begin{bmatrix} 0.4 & 1.7 & 2.3 & 5.3 & 2.2 & 4.4 \\ 5.0 & 3.4 & 2.1 & 6.7 & 5.4 & 1.9 \\ 4.9 & 7.4 & 5.1 & 2.2 & 2.0 & 2.8 \\ 0.9 & 0.8 & 0.6 & 1.1 & 1.1 & 1.7 \end{bmatrix}$$

Because the MWY includes White color channels, these White color channels pass the entirety of the available light to which they are exposed. Magenta and Yellow are complimentary colors and, like the CMY color system discussed above, are selective to and each pass two-thirds of the available light to which the individual color channels are exposed. Thus, for Magenta and Yellow, only one-third of the photons on a given filter element are lost. Since the signal-to-noise ratio depends in large part on the total number of electrons attributed to photons versus the number of electrons attributed to a dark or leakage current, the signal-to-noise ratio is greatly increased by the MWY color system of the invention since much less light is ignored than, for example, an RGB system or a CMY system.

FIG. 3a shows a diagrammatic view of a portion of an imaging system in accordance with an embodiment of the invention. Imaging system 70 includes image sensor 75 in package 72, such as for example a plastic package. Overlying image sensor 75 is lens assembly 80. Infrared blocking filter 85 overlies the lens to inhibit infrared light from striking sensor 75.

In the insert of FIG. 3a is a magnified view of sensor 75. A magnified view of sensor 75 in turn shows some additional sensor components. Included within the components shown in FIG. 3a is upper most metal layer 77 having illustrative openings intended to modulate pixel responsivity. Overlying metal layer 77 is an array or mosaic of CFA material 78 covering, in this instance, four different pixels of sensor 75: One Magenta, two White, and one Yellow. The array or mosaic represents a tiling pattern for the CFA material.

FIG. 3b shows one embodiment of a tiling pattern for a MWY color system over a sensor in accordance with the invention. The tiling pattern provides a substantially rectangular repeating array made up of two White CFA material areas for each of Magenta and Yellow CFA material. In the embodiment shown, White CFA material areas are disposed diagonally in a rectangular array or mosaic. The Magenta and Yellow CFA material areas alternate with the White CFA material area across each row and column of the array or mosaic.

The use of a tiling pattern that utilizes two White CFA material channels for each of Magenta and Yellow CFA material channels has several benefits. First, there is a luminence or lightness/darkness benefit. The typical human visual system is more sensitive to errors in lightness than errors in color. The human visual color system will accept variations in hue or saturation but it is less tolerant to errors in lightness or darkness, i.e., luminence. Since the visual system is keyed to lightness and darkness, the tiling pattern illustrated in FIG. 3b is selected to improve the accuracy of the luminence or lightness/brightness. A White CFA material area has no coloration, so it is, in effect, a brightness measuring pixel. Thus, fully half of the array is devoted to lightness/brightness, making an image reproduced by the color imaging system, such as for example, a camera, acceptable to the human visual system.

The tiling pattern described in FIG. 3b also maximizes the signal-to-noise ratio of the MWY color system. Since the White CFA material area maximizes the number of available photons none of the photons striking the white areas are ignored. Thus, the amount of noise attributable to the White CFA material areas due to dark or leakage current is minimal.

A third benefit of the tiling pattern shown in FIG. 3b is manufacturability. In one embodiment, the White color or CFA material is made up of a glass, such as silicon nitride ($Si_3N_4$) that is commonly used to insulate the upper most metal layer on a sensor device. Thus, only two types of color filter material, for Magenta and Yellow, must be used, and in lesser amounts than the White CFA material, to form the pixel array. Thus, only two CFA materials need to be spun on the sensor device providing a yield advantage and an equipment utilization advantage.

Figure 4A:
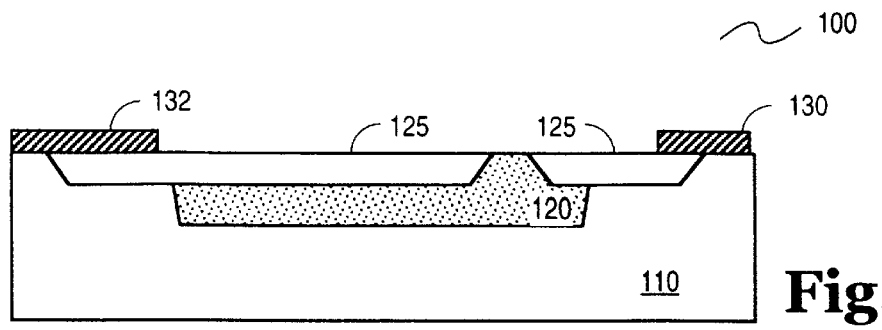
FIG. 4a shows a cross-sectional side view of a pixel after fabrication of active devices and a photosensing portion in accordance with an embodiment of the invention.

FIGS. 4a–4l illustrate cross-sectional side views one embodiment of a process of forming a pixel in an MWY color pixel array. In this example, an image sensing device is a semiconductor chip made up of a number of pixels, each pixel capable of absorbing light. FIG. 4a illustrates a pixel of the invention after fabrication of active devices by conventional processing methods. Pixel 100 is formed of a semiconductor substrate, such as for example an n-type silicon substrate having a p+-type epitaxial layer 110 and an n+-type region 120 in p+-type epitaxial layer 110. The n+-type/p+-type interface forms a photosensing portion or photodiode portion of the pixel. In general, each pixel contains a photosensing portion such as a photodiode, and other pixel circuitry. FIG. 4a shows other elements, including trench oxide 125 and polysilicon layers 130 and 132.

Figure 4B:
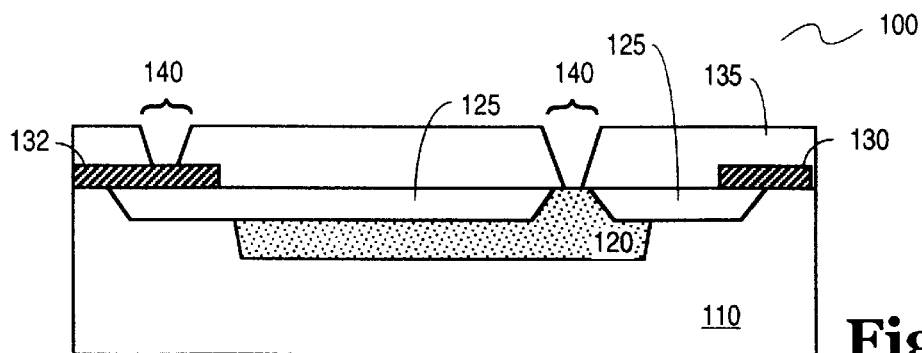
FIG. 4b shows the pixel of FIG. 4a after the subsequent processing step of depositing and patterning a first dielectric layer over the active devices.

FIG. 4b illustrates the pixel of FIG. 4a after the subsequent processing steps of depositing and patterning a first dielectric layer or ILD0 layer 135. Once deposited and formed, ILD0 layer 135 is patterned and etched to form vias 140 (to n-well 120) and 142 (to polysilicon layer 132). In one example, via lithography involves coating ILD0 layer 135 with a photoresist material, exposing the photoresist material, and removing the unexposed photoresist in a developing step. Vias 140 and 142 are then etched with a conventional etchant and the photoresist mask material removed. Via lithography and etch are well known in the art and employ conventional processing steps and processing equipment.

Figure 4C:
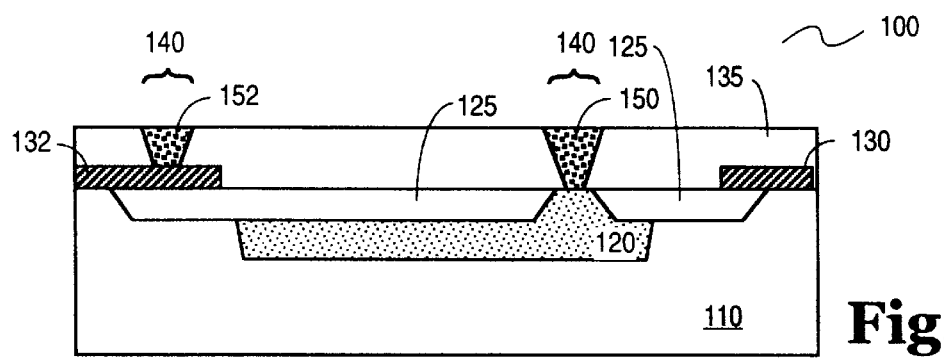
FIG. 4c shows the pixel of FIG. 4a after the subsequent processing step of depositing and planarizing a contact through the first layer of dielectric material.

FIG. 4c shows the pixel after the subsequent processing steps of depositing and planarizing a metal to vias 140 and 142 to form contacts 150 and 152, respectively. In one embodiment, the metal is a chemical vapor deposited (CVD) tungsten. The tungsten is planarized, for example, by a conventional chemical-mechanical polish.

Figure 4D:
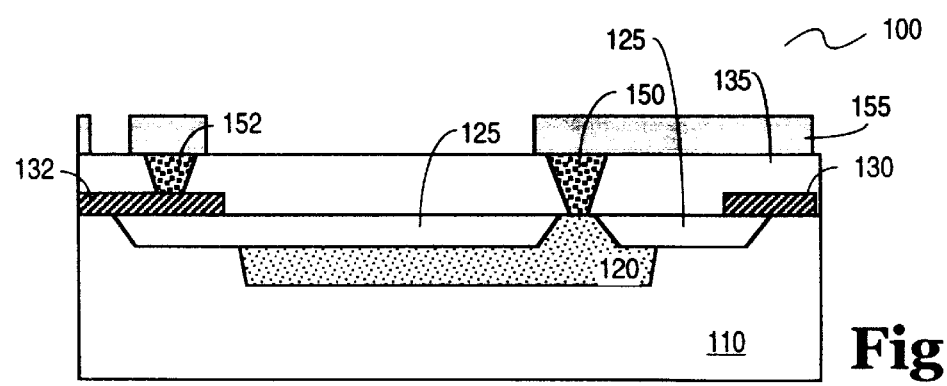
FIG. 4d shows the pixel of FIG. 4a after the subsequent processing step of depositing and patterning a first metal layer over the first dielectric layer.

FIG. 4d shows the pixel after the subsequent processing step of depositing and patterning a first metal layer 155 over ILD0 layer 135, to contacts 150 and 152, respectively. First metal layer 155 is, for example, an aluminum or aluminum alloy. First metal layer 155 is deposited and patterned by conventional processing steps and processing equipment.

Figure 4E:
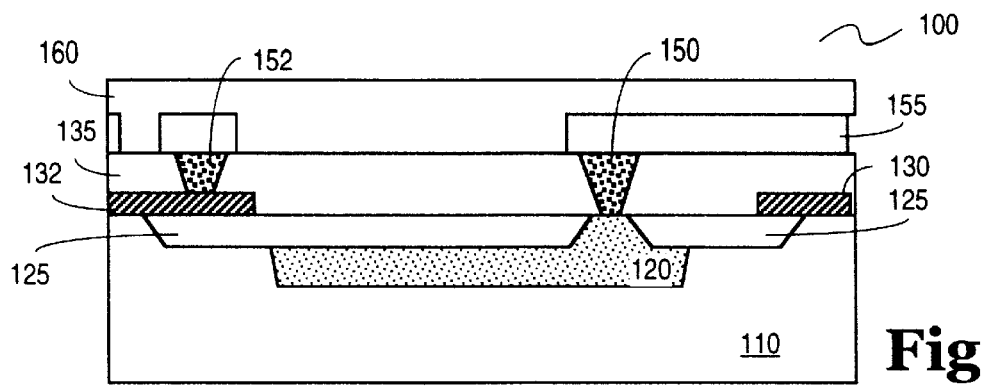
FIG. 4e shows the pixel of FIG. 4a after the subsequent processing step of depositing and patterning a second dielectric layer.

FIG. 4e shows the pixel after the subsequent processing step of depositing and patterning a second dielectric layer or ILD1 layer 160 over first metal layer 155 to electrically isolate first metal layer 155 from additional conductive materials. At this time, ILD1 layer 160 is planarized and openings are made where desired to first metal layer 155. Contacts, such as for example CVD tungsten contacts, are then formed to first metal layer 155 (contacts not shown in this cross-section). The planarizing, lithography, etching, and contact deposition to first metal layer 155 is not shown, but would follow conventional processing steps and processing equipment as noted above with similar steps.

Figure 4F:
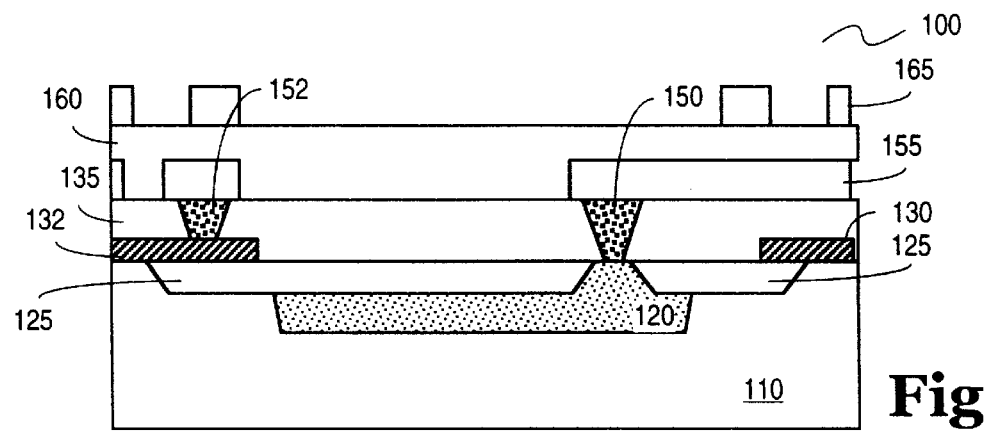
FIG. 4f shows the pixel of FIG. 4a after the subsequent processing step of depositing and patterning a second metal layer over the second dielectric layer.
Figure 4G:
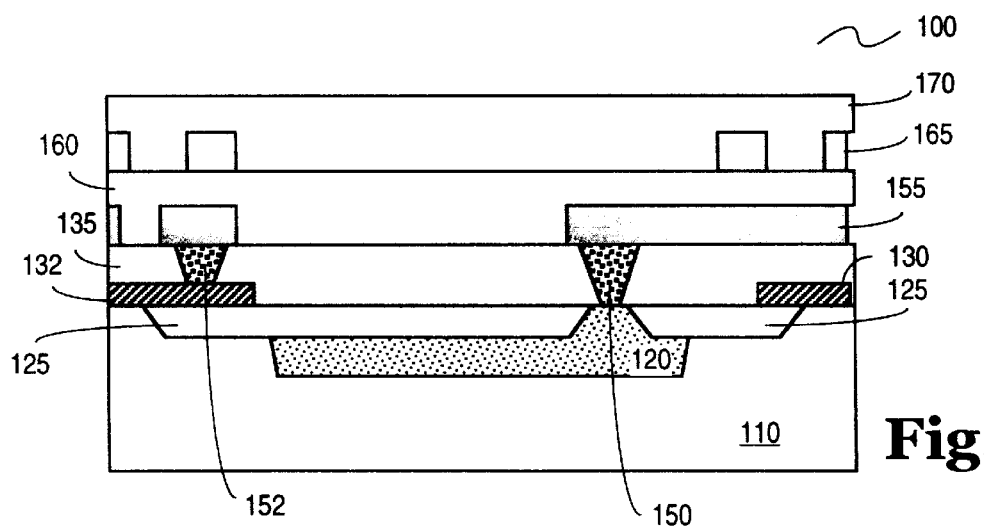
FIG. 4g shows the pixel of FIG. 4a after the subsequent step of depositing and patterning a third layer of dielectric.

FIG. 4f shows the pixel after the subsequent processing step of depositing and patterning a second metal layer 165 over ILD1 layer 160. Second metal layer 165 is typically an aluminum or aluminum alloy layer similar to first metal layer 155. Next, second metal layer 165 is electrically isolated by a third dielectric layer or ILD2 layer 170 as shown in FIG. 4g. Next, ILD2 layer 170 is planarized, such as for example by a chemical mechanical polish, then openings are etched through ILD2 layer 170 to, for example, second metal layer 165 and contacts, such as for example, CVD tungsten contacts, are deposited in the vias. The polishing, lithography, etching, and contact deposition and polish steps are not shown.

Figure 4H:
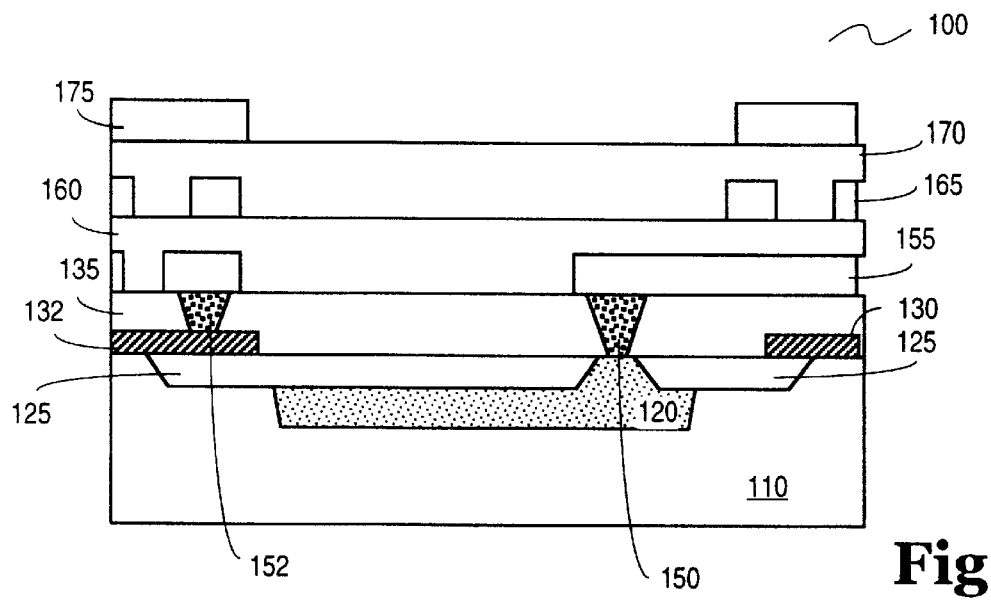
FIG. 4h shows the pixel of FIG. 4a after the subsequent processing step of depositing and patterning a third metal layer over the third dielectric layer.
Figure 4I:
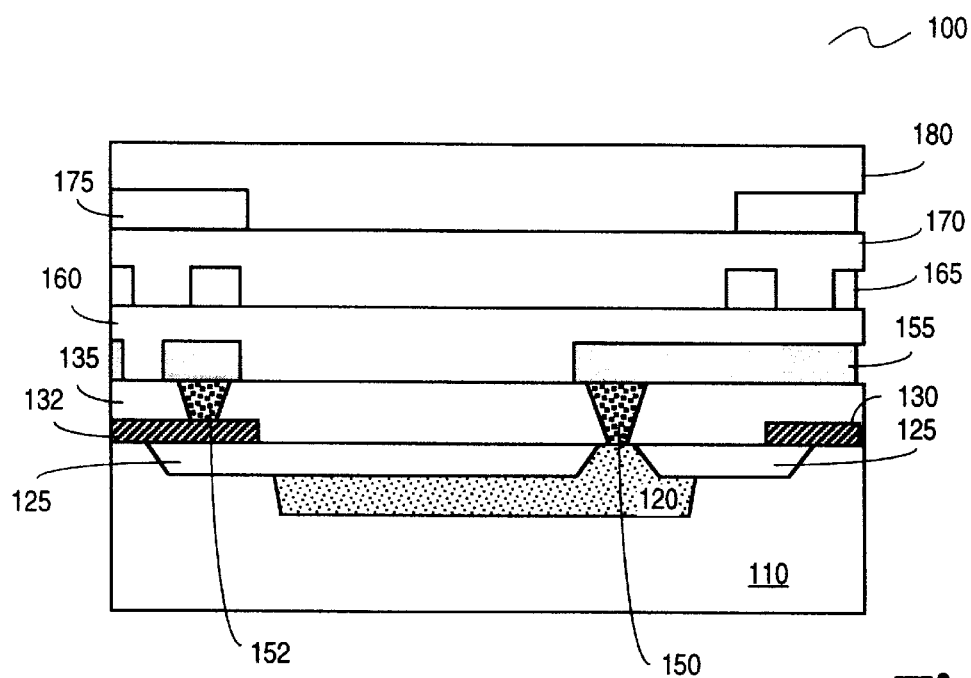
FIG. 4i shows the pixel of FIG. 4a after the subsequent processing step of depositing and patterning a fourth dielectric layer over the third metal layer.

FIG. 4h shows the pixel after the subsequent processing step of depositing third metal layer 175 over planarized ILD2 layer 170. This is followed by the deposition of a fourth dielectric layer or ILD3 layer 180 over the patterned third metal layer 175. ILD3 layer 180 is planarized and vias or openings are made to, for example, third metal layer 175. The pixel after ILD3 layer 180 is planarized as shown in FIG. 4i. Contacts, such as for example CVD tungsten contacts, are then formed to third metal layer 175 (vias and contacts not shown in this cross-section). The steps of polishing, lithography, etching, and contact deposition and polish are not shown.

Figure 4J:
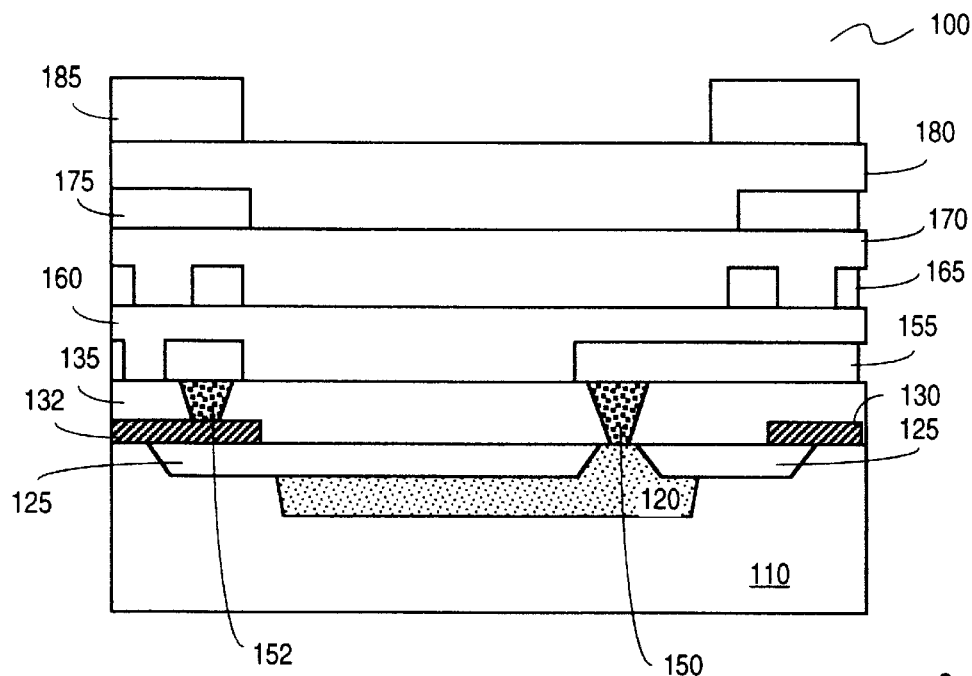
FIG. 4j shows the pixel of FIG. 4a after the subsequent processing step of depositing and patterning a fourth metal layer over the third dielectric layer.

FIG. 4j shows the pixel after the subsequent processing step of depositing and patterning a fourth metal layer 185 over ILD3 layer 180. Fourth metal layer 185 is, for example, electrically coupled to third metal layer 175 through conductive contacts through ILD3 layer 180.

Figure 4K:
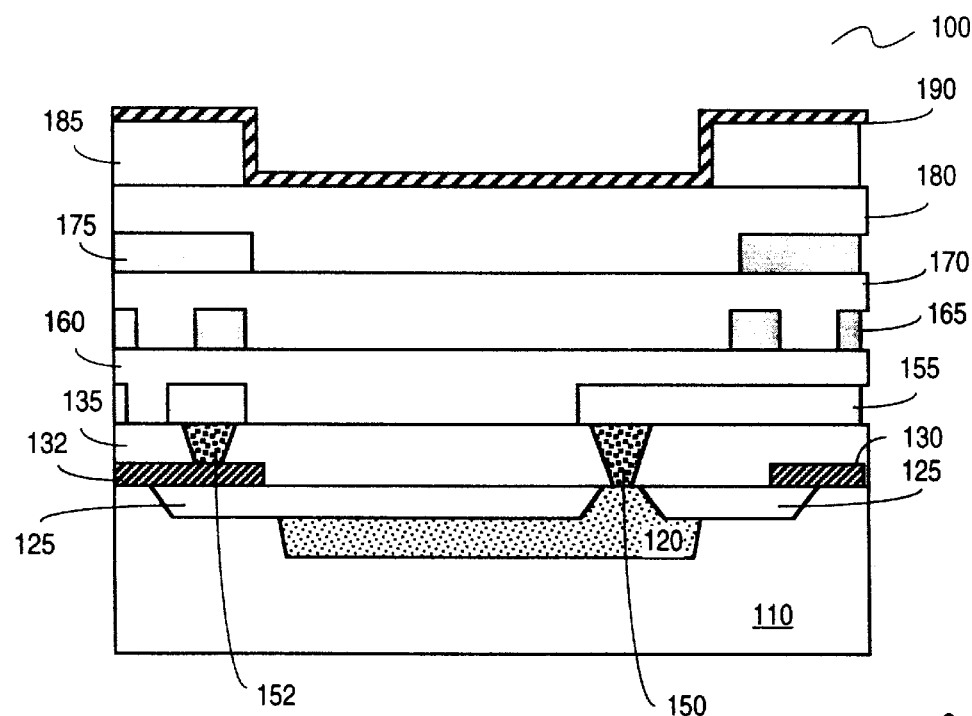
FIG. 4k shows the pixel of FIG. 4a after the subsequent processing step of depositing a passivation layer over the fourth metal layer.

FIG. 4k shows the pixel after the subsequent processing step of depositing a passivation layer 190 over fourth metal layer 185. Passivation layer 190 is, for example, silicon nitride ($Si_3N_4$) conformally deposited to a thickness of approximately 7500 angstroms (Å). Silicon nitride is chosen as the final dielectric/passivation layer in this embodiment because of its ability to resist penetration or attack by moisture or elements such as sodium.

Overlying the photosensing portion of the pixel in the semiconductor substrate are interlayer dielectrics ILD0–ILD3 layers 135, 160, 170, and 180. A conventional dielectric for these layers is a silicon glass. Accordingly, ILD0–ILD3 layers are transmissive to light, i.e., White light, in the visible spectrum. Similarly, passivation layer 190 of silicon nitride is completely transmissive to light, White light, in the visible spectrum. Accordingly, for each White pixel of the MWY system of the invention, the invention contemplates that the White CFA material is the passivation glass, such as for example, silicon nitride passivation layer 190 of the pixel structure. Thus, no further processing steps need to be performed for those pixels designated as White pixels in the sensor pixel array.

Figure 4L:
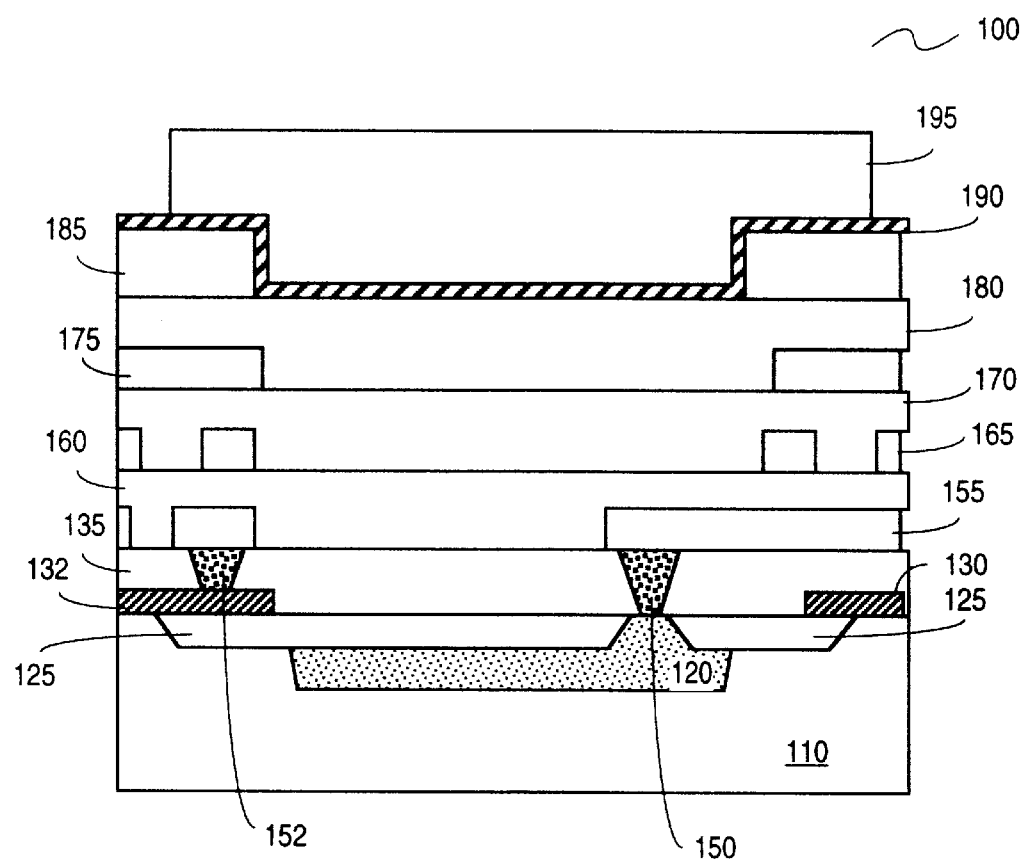
FIG. 4l shows the pixel of FIG. 4a after the alternative processing step of depositing a color filter array material over the pixel.

For those pixels designated to be Magenta or Yellow pixels, a further processing step of depositing an appropriate CFA material is provided. FIG. 4l shows the pixel after the subsequent processing step of depositing a color filter material, such as for example a Magenta CFA material 195, over silicon nitride passivation layer 190. CFA material 195 includes filter material selective to light having a wavelength corresponding to the Magenta region of the visible spectrum. In other words, only light selective to light having a wavelength corresponding to the Magenta region of the visible spectrum will pass through Magenta CFA material 195.

Suitable materials for CFA material in accordance with the invention, such as Magenta CFA material 195 include, but are not limited to, pigmented acrylates, dyed photoresist such as a Novolac resin, and dyed polyimides. In the case of a pigmented acrylate, the material 195 is conformally spun over passivation layer 190 across the top of a wafer containing the sensor array including pixel 100. Pigmented acrylate layer 195 is patterned by exposing areas over the wafer where desired pixels for the Magenta selective light are to be located. Acrylate layer 195 is then exposed to light, such as for example ultraviolet light, to crosslink or polymerize the acrylate. After exposure, the layer is sprayed with a developer and the non-polymerized portion is washed away leaving Magenta light selective areas 195 over the desired pixels of the array(s) of the wafer.

To complete the MWY color system of the invention, the process described above with respect to the Magenta CFA material is repeated with color filter material sensitive to light having a wavelength corresponding to the Yellow region of the visible spectrum. Yellow CFA material 195 is conformally deposited over the entire wafer and patterned over the desired pixels of the array(s) of the wafer.

Figure 5:
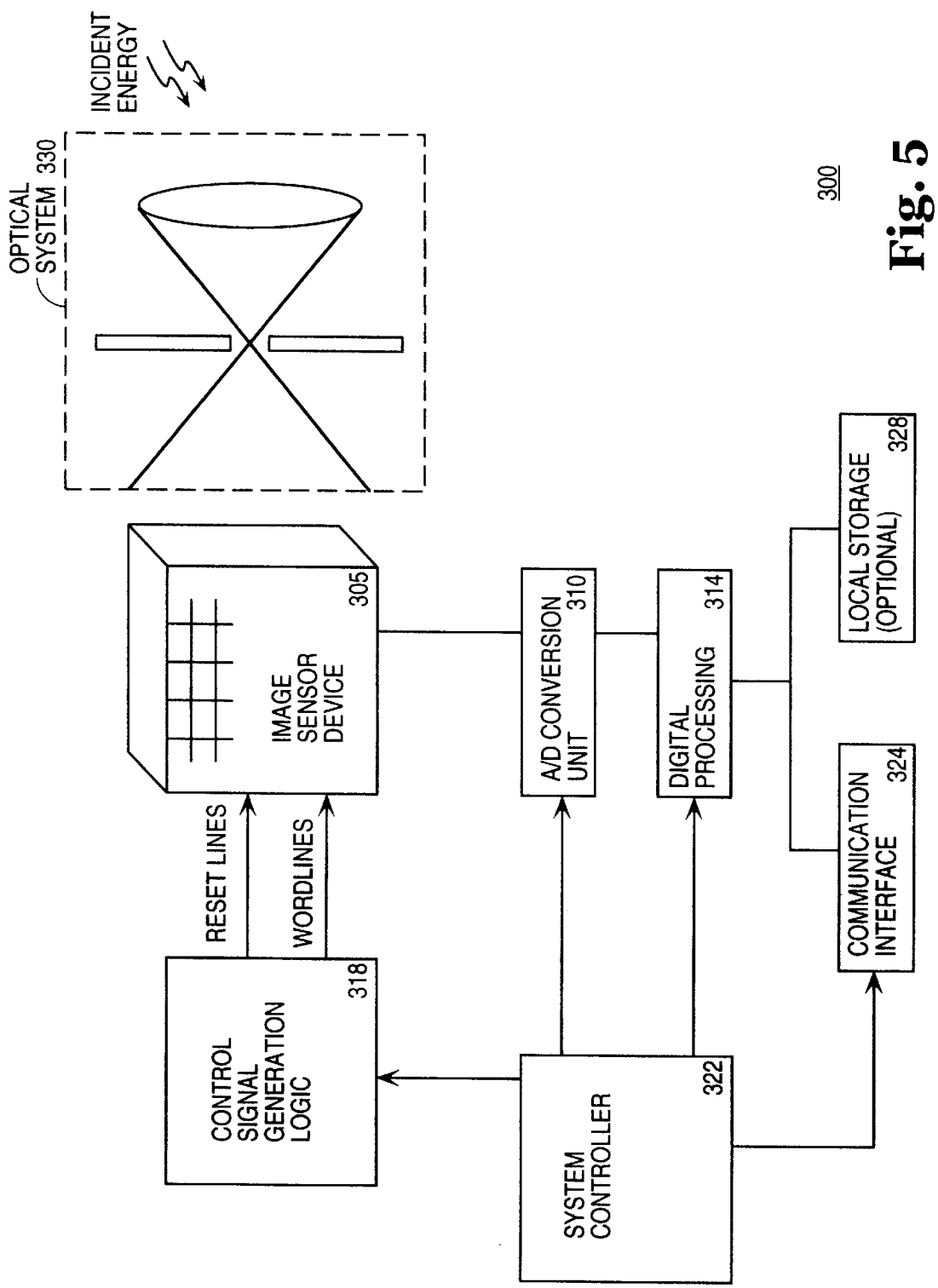
FIG. 5 shows an imaging system incorporating an image sensing device according to the invention.

The image sensing device incorporating an MWY color system described above may be used as part of a digital imaging system 300 shown in FIG. 5. Imaging system 300 has an optical system 330 that channels the incident energy, being light in this case, to create an optical image on image sensing device 305. Control signal generation logic 318 is provided to generate the reset signals in word lines needed to control photo sensors of the image sensor of image sensing device 305. The output values (sensor signals) may be further processed in analog form before being fed to an analog-to-digital (A/D) conversion unit 310 that in turn feeds digital processing block 314. Analog signal processing, the A/D unit, and portions of the digital processing block may be located on the same die as the sensor array. The digital processing may include hard-wired logic and/or a programmed processor that performs a variety of digital functions, including preparing digital image data based on the sensor signals for storage or transmission.

Transmission of the image data to an external processing system may be accomplished using communication interface 324. For instance, as a digital camera, system 300 will contain a communication interface that implements a computer peripheral bus standard such as universal series bus (USB) or IEEE 1394–1995. Imaging system 300 may also contain local storage 328 of the non-volatile variety, for instance including a solid state memory such as a removable memory card, a rotating magnetic device, or other suitable memory device for permanent storage of digital image data.

The operation of system 300 may be orchestrated by system controller 322 which may include a conventional microcontroller responding to instructions stored as firmware.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A color imaging device comprising an array of light selective elements, consisting of a first light selective element selective to light having a wavelength corresponding to magenta, a second light selective element selective to light having a wavelength corresponding to white, and a third light selective element selective to light having a wavelength corresponding to yellow.

2. The device of claim 1, wherein said first, second, and third light selective elements occur in a repeating pattern in said array.

3. The device of claim 1, wherein over a major portion of said array, said second light selective element occurs at every other element position along both of two orthogonal directions.

4. The device of claim 1, wherein said light selective elements are arranged in a substantially rectangular pattern and said first light selective element and said third light selective element alternate with said second light selective element.

5. The device of claim 1, wherein said first light selective element consisting of a first polymer that is selective to light having a wavelength corresponding to magenta and a third polymer that is selective to light having a wavelength corresponding to yellow.

6. A color image sensor comprising:

an array of light sensitive elements; and an array of light selective elements overlying said array of light sensitive elements, said array of light selective elements consisting of a first light selective element over a first light sensitive element selective to light having a wavelength corresponding to magenta, a second light selective element over a second light sensitive element selective to light having a wavelength corresponding to white, and a third light selective element over a third light sensitive element selective to light having a wavelength corresponding to yellow, wherein each of said light selective elements defines a color space for said respective light sensitive elements.

7. The sensor of claim 6, wherein said first, second, and third filter elements occur in a repeating pattern in said filter array.

8. The sensor of claim 6, wherein over a major portion of said array of filter elements, said second filter element occurs at every other element position along both of two orthogonal directions.

9. The sensor of claim 6, wherein said filter elements of said array are arranged in a substantially rectangular pattern and said first filter element and said third filter element alternate with said second filter element.

10. An imaging system comprising:

an imaging sensor having:

an array of light sensitive elements;

an array of light selective elements overlying said array of light sensitive elements and each defining a color space for said light sensitive elements, said array of light selective elements consisting of a first light selective element over a first light sensitive element selective to light having a wavelength corresponding to magenta, a second light selective element over a second light sensitive element selective to light having a wavelength corresponding to white, and a third light selective element over a third light sensitive element selective to light having a wavelength corresponding to yellow;

control circuitry configured to generate control signals for controlling said imaging sensor; and signal processing circuitry for generating image data in response to said sensor signals.

11. The imaging system of claim 10, wherein said first, second, and third filter elements of said imaging sensor occur in a repeating pattern in said filter array.

12. The imaging system of claim 10, wherein over a major portion of said array of said filter elements of said imaging sensor, said second filter element occurs at every other element position along both of two orthogonal directions.

13. The imaging system of claim 10, wherein said filter elements of said array of filter elements of said imaging sensor are arranged in a substantially rectangular pattern and said first filter element and said third filter element alternate with said second filter element.

* * * * *